US009964565B2

(12) United States Patent
Soleillant et al.

(10) Patent No.: US 9,964,565 B2
(45) Date of Patent: May 8, 2018

(54) DETECTOR FOR OVERHEAD NETWORK AND OVERHEAD NETWORK COMPRISING SUCH A DETECTOR

(71) Applicant: Schneider Electric Industries SAS, Rueil-Malmaison (FR)

(72) Inventors: Alexandre Soleillant, Roche la Molière (FR); Pascal Houbre, Jarrie (FR); Erick Contini, Meylan (FR); Alain Moreux, Dijon (FR); Michel Clemence, Chambery (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 153 days.

(21) Appl. No.: 14/854,333

(22) Filed: Sep. 15, 2015

(65) Prior Publication Data

US 2016/0091533 A1 Mar. 31, 2016

(30) Foreign Application Priority Data

Sep. 26, 2014 (FR) ...................................... 14 59146

(51) Int. Cl.
*G01R 15/18* (2006.01)
*H02G 7/00* (2006.01)
*G01R 1/04* (2006.01)

(52) U.S. Cl.
CPC ........... *G01R 15/18* (2013.01); *G01R 15/186* (2013.01); *H02G 7/00* (2013.01); *G01R 1/04* (2013.01)

(58) Field of Classification Search
CPC .................. G01R 15/142–15/16; G01R 15/186
(Continued)

(56) References Cited

U.S. PATENT DOCUMENTS 4,646,006 A 2/1987 Schweitzer, Jr. et al.
4,709,339 A * 11/1987 Fernandes .............. G01K 1/024
324/127

(Continued)

FOREIGN PATENT DOCUMENTS

WO WO 2010/042442 A1 4/2010
WO WO 2012/159698 A1 11/2012

OTHER PUBLICATIONS

French Preliminary Search Report issued Jun. 8, 2015 in French Application 14 59146, filed on Sep. 26, 2014 ( with English Translation of Categories of Cited Documents).

*Primary Examiner* — Patrick Assouad
*Assistant Examiner* — Demetrius Pretlow
(74) *Attorney, Agent, or Firm* — Oblon, McClelland, Maier & Neustadt, L.L.P.

(57) ABSTRACT

A detector for detecting at least one electric quantity in an electric conductor, and an overhead network for distributing electricity. The detector includes a frame on which a mechanism is fixed, the mechanism including a magnetic toroid, divided into two branches rotatable around an axis defined by the frame, between a separated position and a position closed around the electric conductor, a current sensor, divided into two branches rotatable around an axis defined by the frame, between a separated position and a position closed around the electric conductor, the current sensor performing an AC current measurement, a force transmitting element transmitting a rotational force to the magnetic toroid and the current sensor, the element being provided with at least one portion to receive the conductor by bearing, and a first clamp including two clamp arms, and a second clamp including two clamp arms.

12 Claims, 5 Drawing Sheets

(58) Field of Classification Search
USPC .......................................................... 324/127
See application file for complete search history.

(56) References Cited

U.S. PATENT DOCUMENTS

| | | | | |
|---|---|---|---|---|
| 7,006,010 B2* | 2/2006 | Thomas | ............... | G01R 15/186 |
| | | | | 324/126 |
| 8,274,273 B2* | 9/2012 | Nguyen | ............... | H01M 2/1055 |
| | | | | 173/170 |
| 8,760,151 B2* | 6/2014 | McBee | .................. | H01F 27/06 |
| | | | | 324/117 R |
| 9,007,077 B2* | 4/2015 | El-Essawy | ........... | G01R 15/205 |
| | | | | 324/117 H |
| 2010/0084920 A1* | 4/2010 | Banting | ............... | G01R 15/142 |
| | | | | 307/66 |
| 2012/0038446 A1 | 2/2012 | McBee et al. | | |
| 2012/0039061 A1 | 2/2012 | McBee et al. | | |
| 2012/0039062 A1 | 2/2012 | McBee et al. | | |
| 2012/0169324 A1* | 7/2012 | Worones | .................. | G01R 1/22 |
| | | | | 324/126 |
| 2012/0256617 A1* | 10/2012 | Moreux | ............... | G01R 15/181 |
| | | | | 324/126 |
| 2014/0097924 A1 | 4/2014 | Thorner et al. | | |
| 2014/0347037 A1 | 11/2014 | McBee et al. | | |
| 2015/0331025 A1* | 11/2015 | Arashima | ........... | G01R 15/142 |
| | | | | 702/62 |
| 2016/0077133 A1* | 3/2016 | Lee | ...................... | G01R 15/181 |
| | | | | 324/127 |

* cited by examiner

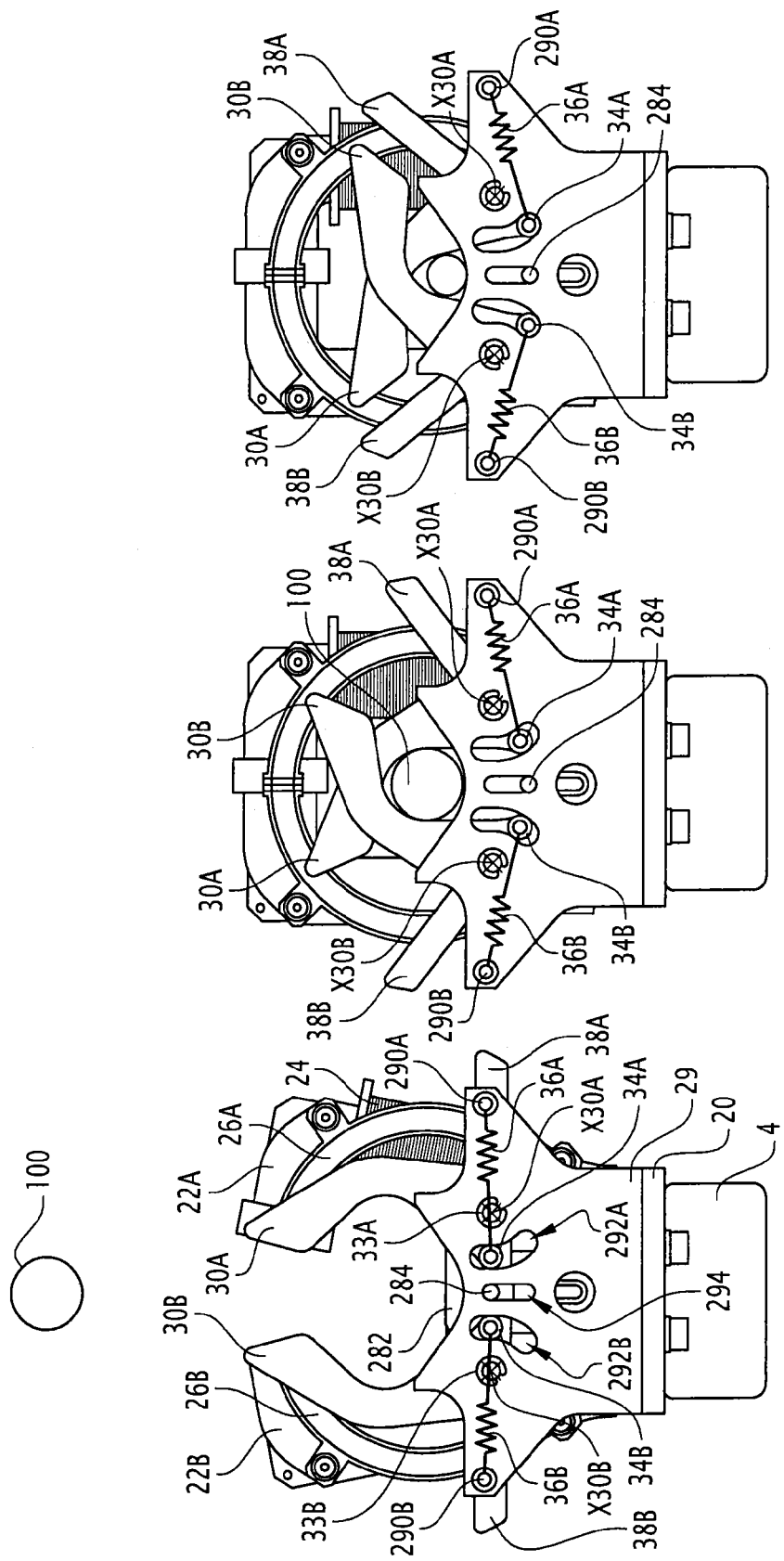

DETECTOR FOR OVERHEAD NETWORK AND OVERHEAD NETWORK COMPRISING SUCH A DETECTOR

The present invention relates to a detector for detecting at least one electrical quantity in an electric conductor, as well as an overhead electricity distribution network comprising such a detector.

In the field of overhead electrical distribution networks, one of the major responsibilities for companies in the sector is to ensure the operation of the network and minimize the number of power outages. When there is an outage in the distribution, in order to reestablish electricity as quickly as possible, it is necessary to identify and locate the fault. Furthermore, a very common drawback in distribution is a phase shift of the current relative to the voltage, which may occur along the transmission line.

In this respect, it is known to use, in an overhead network, fault detectors installed on transmission lines of the overhead network. Their commissioning may take place when the distribution network is operating, i.e., when the transmission lines are carrying a medium- or high-voltage current. Likewise, the maintenance of the detectors is done in an operating situation of the network. The commissioning and maintenance of these detectors are difficult and dangerous procedures. It is therefore important to provide a detector that can easily be reliably installed. In particular, its fastening to the transmission lines must be lasting, while producing a significant closing effect independent of the diameter of the conductor of the network on which it must be attached, and require few checks by operators.

The detection of a fault is done with a measurement of the current and an estimate of the phase shift between the current and the voltage transmitted by the line. The detector therefore includes sensors or electronic components that must be supplied with electricity. In that respect, it is known from WO-A-2010/042565 or WO-A-2010/042422 to use a magnetic toroid to provide electricity to the sensors and electronic components of the detector. According to this approach, the magnetic toroid closes around the electric conductor of the transmission line and it is configured to induce an electric current in the turns of a coil wound around the magnetic toroid.

It is also known, for example from US-A-2008/0077336, to install a detection device on a high-voltage line, that device comprising a magnetic supply toroid for a computer, the computer being configured to process the parameters measured by the detector and send them to a concentrator via a radio communication.

Lastly, it is known from WO-A-2012/021478 to use a system of clamps and magnetic toroid to install a detector on a transmission line of an overhead network and to power the electric sensors of the detection device. The clamps close around the electric conductor owing to a screw/nut system. This requires operators to rotate the screw of the screw/nut system with a stick, which is time-consuming, tiresome and potentially dangerous. Lastly, good fastening depends on good tightening by the operator.

The present invention more particularly aims to resolve these drawbacks by proposing a new detector in which the installation is secured, in particular owing to an innovative fastening system.

To that end, the invention relates to a detector for detecting at least one electric quantity in an electric conductor, the detector comprising a frame on which a mechanism unit is fixed. The mechanism unit includes a magnetic toroid, divided into two branches rotatable around an axis defined by the frame, between a separated position and a position closed around the electric conductor, the magnetic toroid having a coil wound around at least one of the two branches. The mechanism unit also comprises a current sensor, divided into two branches rotatable around an axis defined by the frame, between a separated position and a position closed around the electric conductor, the current sensor performing an AC current measurement. The mechanism unit also includes an element transmitting a rotational force to the magnetic toroid and the current sensor, the element being provided with at least one portion able to receive the conductor by bearing, and at least two clamps for anchoring the detector on the electric conductor, each clamp being rotatable around an axis parallel to the rotation axis of the branches of the magnetic toroid and defined by the frame, between an open position and a locked position of the clamp. The detector also comprises a base, and at least one electronic device able to send a parameter of the current detected by the current sensor. According to the invention, the force transmitting element is extended by a trigger, while each anchoring clamp has a portion in contact with the trigger and bears a member protruding in a direction parallel to its axis of rotation, the protruding member being movable with its clamp between open position and the closed position. Furthermore, a spring is stretched between the protruding member and a part fixed on the frame. The spring exerts a rotational torque on the clamp and tends to move it toward its open position or its locked position as a function of the angular position of the clamp relative to the rotation axis. Furthermore, between the open position and the locked position, the clamp passes through a neutral position, or the protruding member, its axis of rotation and the fixed part are aligned and the spring does not exert a rotational torque on the clamp.

Owing to the invention, the anchoring clamps ensure lasting closing on the electric conductor, irrespective of its diameter. Springs produce constant gripping forces independent of the operator for the fastening system, as well as for the measuring and self-powering system. Furthermore, the invention provides an architecture of the detector that produces the closing of the mechanism unit in a single operation, the travel of the clamps, the toroid and the current sensor being independent of one another. The detector is commissioned using a standard stick and provides advantages in terms of time, fatigue, and even feasibility relative to the prior art solutions. The self-powering also makes it possible to take continuous measurements and communicate the measured properties to a control center periodically, and therefore to offer a high-performing control system in parallel.

According to advantageous but optional aspects of the invention, such a detector may incorporate one or more of the following features, considered in any technically allowable combination:

When it is in its locked position, each clamp is in contact with the electric conductor, which constitutes an end-of-travel stop for the locking of each clamp, irrespective of its diameter.

When they are in the closed position, the branches of the magnetic toroid and the branches of the current sensor bear against one another, independently of the diameter of the electric conductor.

The radial distance between the rotation axis of a clamp and the protruding member is at least two times smaller than the radial distance between the rotation axis of the clamp and the fixed part at the frame.

The detector includes a covering system comprising two covers that surround the mechanism unit and are movable therewith to close around the conductor, while the detector includes at least one elastic return member for the magnetic toroid and at least one elastic return member for the covering system, returning them toward their respective positions closed around the electric conductor.

The current sensor is secured to the magnetic toroid.

The mechanism unit is provided with two pairs of anchoring clamps for anchoring the detector on the electric conductor, these pairs of clamps being positioned on either side of the magnetic toroid, along the rotation axis of one of its branches.

The current sensor is a Rogowski coil.

The electronic device includes a voltage sensor, the potential connection of which is done by the anchoring clamps and an electronic board provided with a computer to process an output signal of the voltage sensor and generate a radio signal based on that signal.

The invention also relates to an overhead network for carrying electric current including three transmission lines, each line being made up of an electric conductor and provided with a detector for at least one parameter of an AC current in the electric conductor, and a concentrator able to receive radio signals transmitted by the detectors and configured to process those radio signals. This network is characterized in that at least one detector is as mentioned above.

The invention will be better understood, and other advantages thereof will appear more clearly, in light of the following description of one embodiment of a detector and an overhead network according to its principle, provided solely as an example and done in reference to the appended drawings, in which:

FIG. 8 is a side view of the detector of FIG. 4, when the detector is in an open configuration;

FIG. 9 is a side view of the detector of FIG. 4 when the detector is in a configuration locked around an electric conductor with a large diameter;

FIG. 10 is a side view of the detector of FIG. 4 when the detector is in a configuration locked around an electric conductor with a small diameter;

Figure 11:
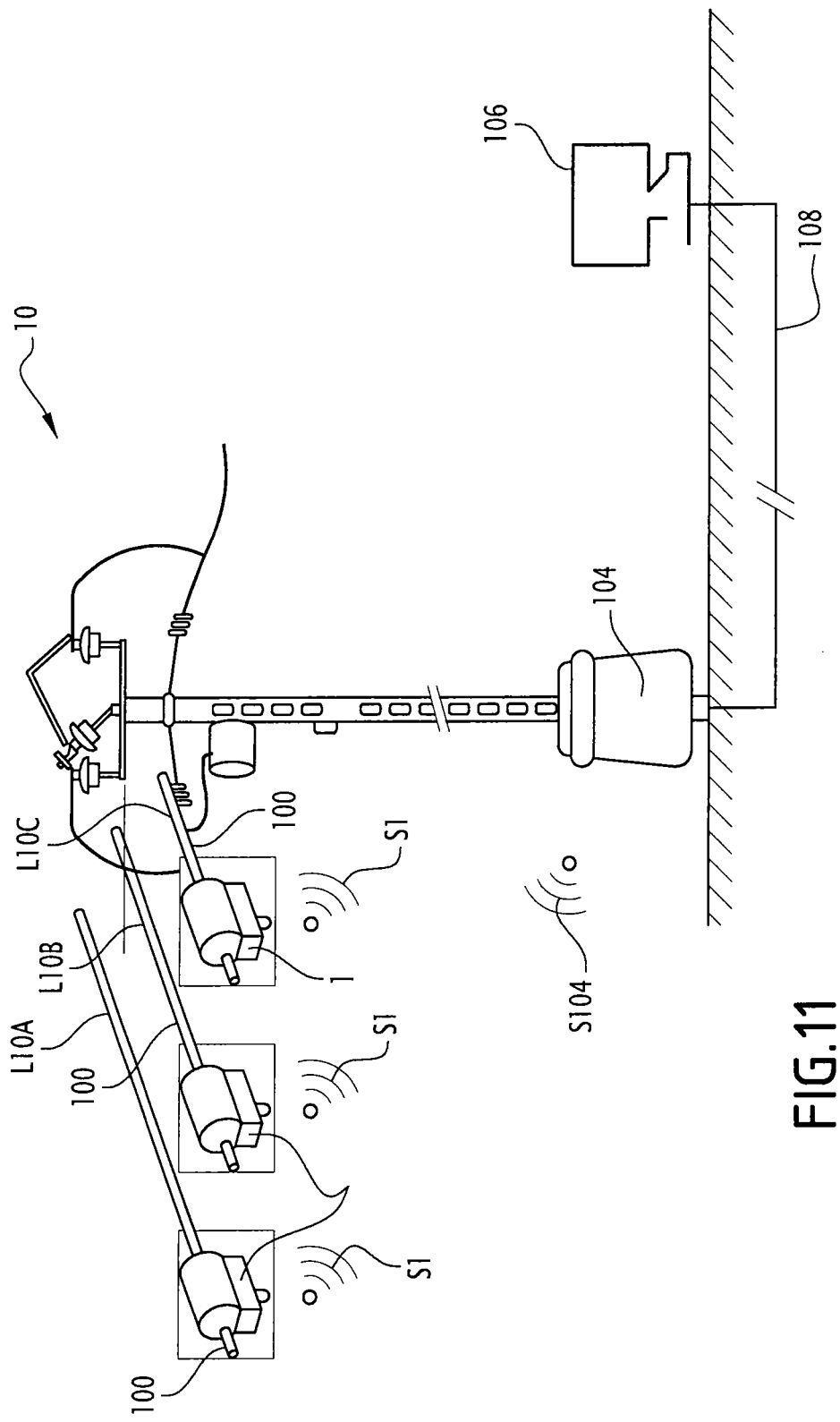
FIG. 11 is a diagrammatic illustration of an overhead network according to the invention, each transmission line including a detector according to the invention as shown in FIGS. 1 to 10.

The medium-voltage overhead network 10 is shown in FIG. 11 and includes three transmission lines L10A, L10B and L10C, each line being made up of an electric conductor 100. Each transmission line L10 is equipped with a detector 1 for detecting at least one parameter of an AC current flowing in the electric conductor 100, the detector being configured to transmit radio signals S1. The overhead network 10 is also equipped with a concentrator 104, able to receive the radio signals transmitted by the detectors 1 and configured to process those radio signals S1. When the concentrator 104 has analyzed the data sent with the radio signals S1, it sends the results to a control center 106 through a wired connection line 108 or via long-range radio signals. The concentrator 104 can also transmit radio control signals S104 to detectors 1. In another embodiment of the invention, the functions of the concentrator 104 are performed by one or each detector 1.

The detector 1, shown in FIGS. 1 to 10, is a device for detecting at least one parameter of an AC current in the electric conductor 100. This parameter can be the phase, intensity or voltage flowing in the conductor 100 of the line L10. This detector 1 includes a covering system 5 comprising two covers 50A and 50B that are rotatable around two parallel axes X51A and X51B defined by the detector 1, between an open position and a position closed around the electric conductor 100. References 500A and 500B denote the contact surfaces of the covers 50A and 50B. When the system 5 is closed, the surfaces 500A and 500B bear against one another. Each cover 50A and 50B is provided with a handle 502A and 502B and an inner finger 504A and 504B. The covering system 5 is fastened on a base 4 that is provided with two side wings 40A and 40B that allow the covers 50A and 50B to slide during opening. The base 4 also includes two flanges 42 for the lateral guiding of the covers 50A and 50B and an anchoring ring 44 shown only in FIGS. 1 and 6, for clarity of the drawing. The covering system 5 surrounds an electronic device 6.

Figure 4:
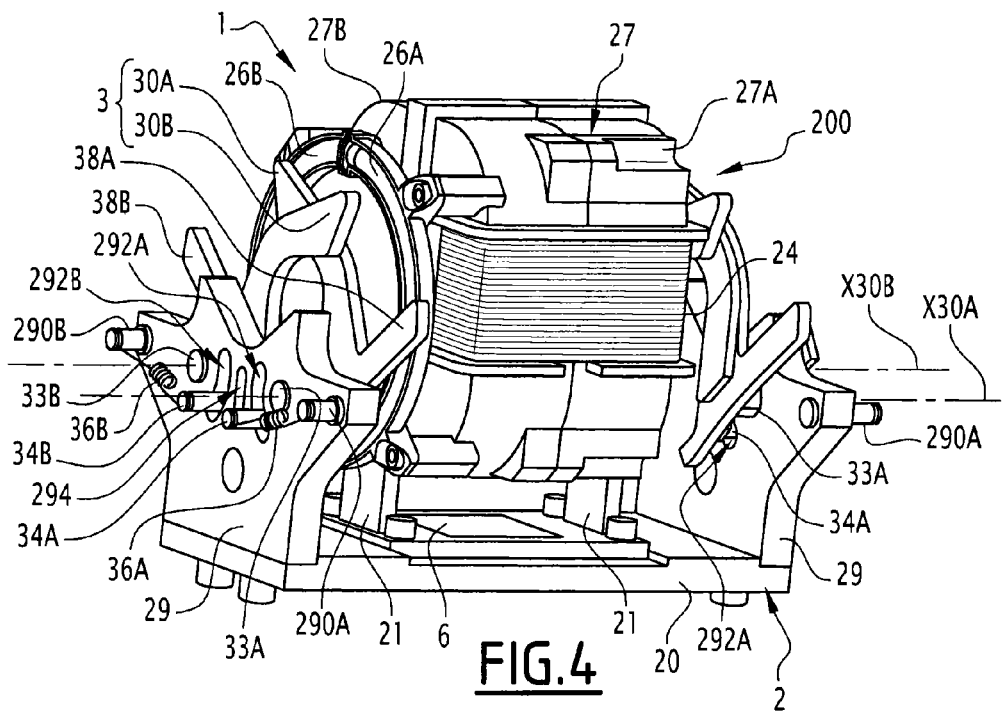
FIG. 4 is a partial perspective view of the detector of FIG. 1 in the closed position, from which the covering system has been omitted for clarity of the drawing.
Figure 5:
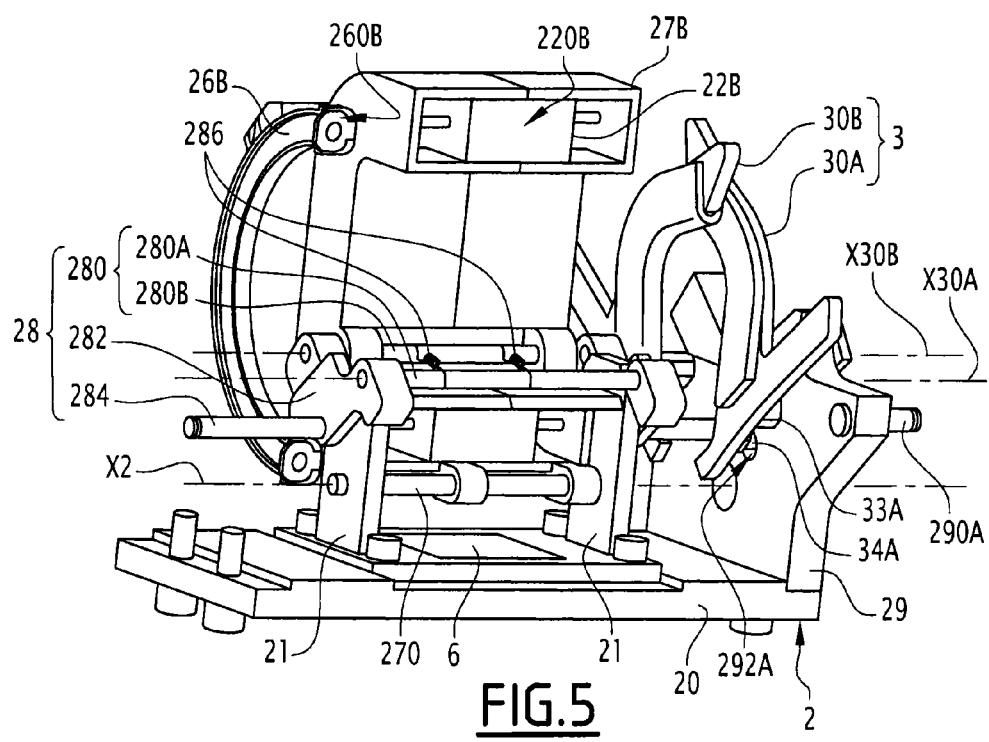
FIG. 5 is a partial perspective view of the detector of FIG. 1 in the closed configuration, in which the covering system, part of the frame, some anchoring clamps, a branch of the magnetic toroid and a branch of the current sensor have been omitted for clarity of the drawing.

The electronic device 6 includes a voltage sensor and an electronic board provided with a computer, the computer processing an output signal from the current and/or voltage sensors and generating a radio signal based on those signals. Only the enclosure of the electric device 6 is shown in FIGS. 4 and 5, its components not being shown for clarity of the drawings.

The covering system 5 also surrounds a frame 2 including a plate 20 and two bearings 21 that protrude perpendicular to the plate 20. The bearings 21 support a mechanism unit 200. The mechanism unit 200 includes a magnetic toroid 22, a coil 24, a current sensor 26, a lid 27 and a force transmitting element 28. The mechanism unit 200 also includes two pairs of clamps 3.

The magnetic toroid 22 is divided into two branches 22A and 22B, those branches being rotatable, around a shared axis X2 defined by the frame 2, between a separated position and a position closed around the electric conductor 100. References 220A and 220B denote the contact surfaces of the branches 22A and 22B. When the toroid 22 is closed, the surfaces 220A and 220B bear against one another. The coil 24 is wound on the branch 22A of the magnetic toroid 22.

The current sensor 26 is divided into two branches 26A and 26B, the branches being rotatable, around the axis X2, between a separated position and a position closed around the electric conductor 100. References 260A and 260B denote the contact surfaces of the branches 26A and 26B. When the sensor 26 is closed, the surfaces 260A and 260B bear against one another. The current sensor 26 performs an AC current measurement. In the example of the figures, the sensor 26 is a Rogowski coil. Alternatively, it may involve traditional ferromagnetic sensors.

The magnetic toroid 22 is secured to the current sensor 26 via the lid 27 that surrounds them. In particular, the branch 22A of the magnetic toroid 22 is secured to the branch 26A of the current sensor 26, in rotation around the axis X2, via a branch 27A of the lid 27, while the branch 22B of the magnetic toroid 22 is secured to the branch 26B of the current sensor 26, in rotation around the axis X2, via a branch 27B of the cover 27. The two branches 27A and 27B are attached to a bar 270 that extends between the two bearings 21 parallel to the plate 20 of the frame 2. In particular, the rotation axis X2 of the magnetic toroid 22 and the current sensor 26 is defined by the longitudinal axis of that bar 270.

Reference 280 defines a central body of the force transmitting element 28. The central body 280 of the force transmitting element 28 comprises two shafts 280A and 280B. Two springs 286 are stretched between the shafts 280A and 280B. The central body 280 is delimited on two sides by two portions 282, able to receive the electric conductor 100 by bearing. Each portion 282 is extended axially, opposite the shafts 280A and 280B, by a trigger 284. The element 28 is configured to transmit a rotational force to the branches 27A and 27B of the lid 27. The lid 27, which surrounds and rigidly secures the magnetic toroid 22 and the current sensor 26, then transmits the rotational force to the branches 22A and 22B as well as the branches 26A and 26B.

The pairs of clamps 3 are positioned on either side of the force transmitting element 28, along the axis X2 of the frame 2. The pairs of clamps 3 each include two clamps 30A and 30B. Each clamp 30A is rotatable around an axis X30A defined by the frame 2, between an open position and a position locked on the conductor 100. Additionally, each clamp 30B is rotatable around an axis X30B defined by the frame 2, between an open position and a position locked on the conductor 100. The clamps 30A and 30B are each provided with a portion 32A and 32B that bears against the trigger 284 of the force transmitting element 28. Furthermore, the clamps 30A and 30B each bear a member 34A and 34B protruding parallel to the axes X30A and X30B, in a direction parallel to the respective axis of rotation X30A and X30B. The protruding members 34A and 34B are movable with the clamps 30A and 30B during the movement between their open position and their position locked on the conductor 100. The axes X30A and X30B respectively correspond to the longitudinal axes of the shafts 280A and 280B of the element 28.

Furthermore, the clamps 30A and 30B are installed such that, when they move toward the locked position, they intersect until coming into contact with the electric conductor 100, which constitutes an end-of-travel stop for their locking. The clamps 30A and 30B are each provided with one end 38A and 38B that bears against a finger 504A or 504B of the covers 50A and 50B. The pairs of clamps 3 act to anchor the detector 1 on the electric conductor 100.

The frame 2 includes two side walls 29. Each wall 29 is provided with two fixed pins 290A and 290B, protruding in a direction parallel to the axis X2 and opposite the pairs of clamps 3. Each wall 29 is also provided with two apertures 292A and 292B, designed to receive the protruding members 34A and 34B, and an aperture 294 that receives the trigger 284.

Each clamp 30A and 30B bears a circular finger 33A, 33B, respectively, aligned on the axis X30A or X30B and which extends on the same side as its protruding member 34A or 34A. Each finger 33A and 33B is mounted rotatably in a circular bore with a corresponding shape, arranged in the adjacent wall 29. Thus, each clamp 30A or 30B is articulated on a wall 29, around its rotation axis X30A or X30B, by engaging its finger 33A or 33B in the corresponding bore that is centered on that rotation axis.

The apertures 292A and 292B have an arc of circle shape respectively centered on the axes X30A and X30B, while the aperture 294 is rectilinear and perpendicular to the plate 20.

A spring 36A is stretched between the protruding member 34A and the fixed pin 290A on the side of the wall 29 opposite the pair of clamps 3. Similarly, a spring 36B is stretched between the protruding member 34B and the fixed pin 290B.

Figure 7:
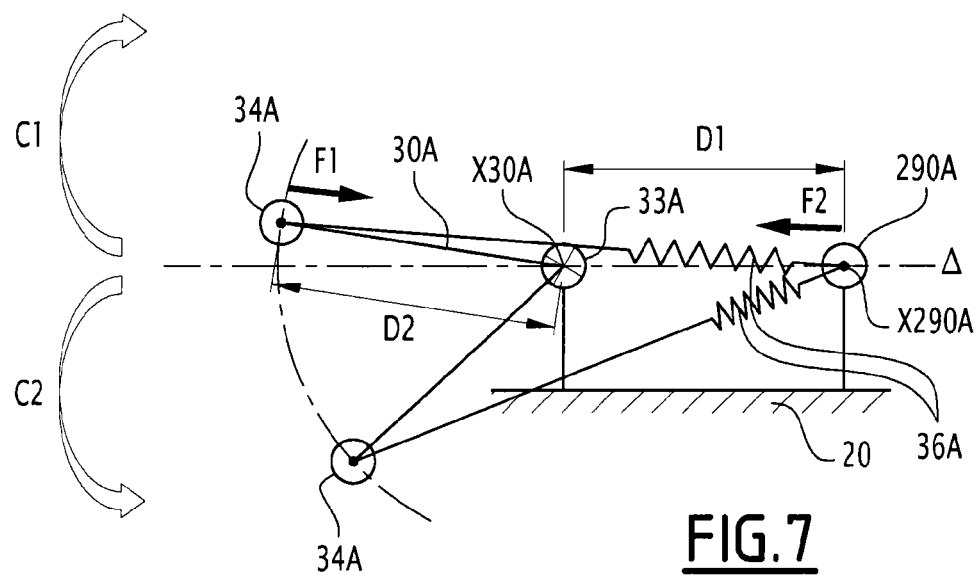
FIG. 7 is a diagrammatic side illustration of the detector of FIG. 1, which explains the operation of a spring responsible for moving an anchoring clamp from its open position toward its locked position, or vice versa.

The springs are used for the movement of the clamps 30A and 30B toward their open position or their locked position. FIG. 7 refers to the clamp 30A visible on the left side of FIG. 4 and diagrammatically describes the operating principle for opening and locking. The following explanation is applicable to all of the clamps of the detector 1.

Figure 6:
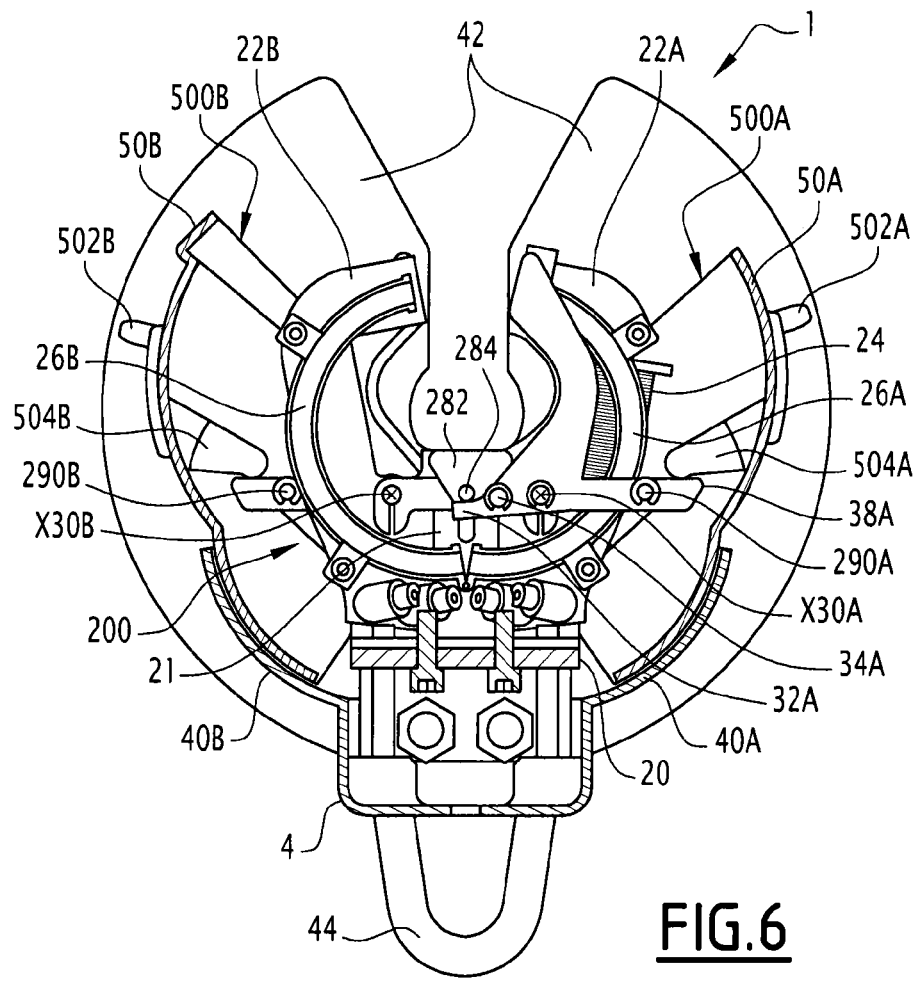
FIG. 6 is a sectional view of the circuit breaker of FIG. 1 along plane VI in FIG. 1, certain elements being omitted for clarity of the drawing.

Reference X290A denotes the longitudinal axis of the pin 290A that is parallel to the axes X2 and X30A. Reference $\Delta$ denotes a line perpendicular to the axes X30A and X290A and secant with those axes. The line $\Delta$ is parallel to the plate 20 of the frame 2. Reference D1 denotes the distance between the axes X290A and X30A measured parallel to the line $\Delta$, i.e., radially relative to the axes X30A and X290A. The protruding member 34A, inserted into the aperture 292A, rotates around the rotation axis X30A, the member 34A being secured to the clamp 30A. In FIG. 7, the clamp 30A is diagrammatically shown by a connecting rod that defines a lever arm and extends between the member 34A and the rotation axis X30A. Reference D2 denotes the distance between the member 34A and the rotation axis X30A measured radially to the axis X30A, i.e., the length of the lever arm. In this illustration, the distance D1 is substantially equal to the distance D2, but in practice, and as shown in FIGS. 4 and 6, the distance D2 is equal to approximately 50% of the distance D1. It is provided that the distance D2 is less than or equal to half of the distance D1. Indeed, a ratio D2/D1 less than or equal to 0.5 makes it possible to obtain strong movement torques of the clamp 30A, with small variations of the spring 36A.

The spring 36A exerts a force F1 on the member 34 toward the fixed pin 290A and a force F2 on the fixed pin 290A toward the member 34, those forces F1 and F2 having equal intensities and opposite directions.

When the member 34A is located on the line $\Delta$, the torques associated with the forces F1 and F2 cancel one another out and the spring 36A does not produce any movement torques on the clamp 30A. This corresponds to an unstable neutral or equilibrium position. When the clamp 30A is in an open or semi-open position, the member 34A is located above the line $\Delta$. The forces F1 and F2 cause an opening torque C1 on the clamp 30A, the torque C1 being in the clockwise direction in FIG. 7. The torque C1 pushes or keeps the clamp 30A in its completely open position, which is therefore a stable position. When the conductor 100 bears on the portion 282 of the element 28, the trigger 284 bears against the portion 32A of the clamp 30A, which is therefore set in rotation around the axis X30A in the counterclockwise direction in FIG. 7. The force of the trigger 284 opposes the torque C1 and pushes the member 34A below the line $\Delta$. Thus, the forces F1 and F2 then cause a locking torque C2 on the clamp 30A, the torque C2 being in the counterclockwise direction in FIG. 7. The torque C2 pushes or keeps the clamp 30A toward its completely locked position where the clamp 30A is in contact with the electric conductor 100, which constitutes an end-of-travel stop for the locking, irrespective of its diameter. The locked position of the detector 1 is a stable position. This then allows the detector 1 to attach to electric conductors with different diameters.

The element 28 transmits the torque generated by the springs 36A and 36B to the branches 27A and 27B of the lid 27, as explained above. The springs 286 contribute to the opening and closing phases of the lid 27, parallel to the springs 36A and 36B. The operation of the springs 286 is similar to that of the spring 36A described above. In particular, in reference to FIG. 5, three points can be identified on each portion 282: the shaft 280A, the base of the trigger 284 and the shaft 280B. These three points respectively correspond to the three points of FIG. 7, i.e., the protruding member 34A, the finger 33A and the pin 290A. The spring 286 is stretched between the shaft 280A and 280B, the shaft 280B is secured to the base of the trigger 284 and a connecting rod that forms a lever arm is present between the shaft 280 and the base of the trigger 284. The springs 286 therefore produce a torque C1 or a torque C2, as a function of the position of those three points.

Furthermore, the covering system 5 includes two springs 506 that operate in a manner similar to that described above for the spring 36A. The springs are inside the covers 51A and 51B and are anchored on the axes X51A and X51B.

The torque produced by these springs 506 and 286 is consistent with the torque produced by the springs 36A and 36B, such that all of the springs of the detector 1 cause either the opening or closing of the parts on which they act.

Figure 1:
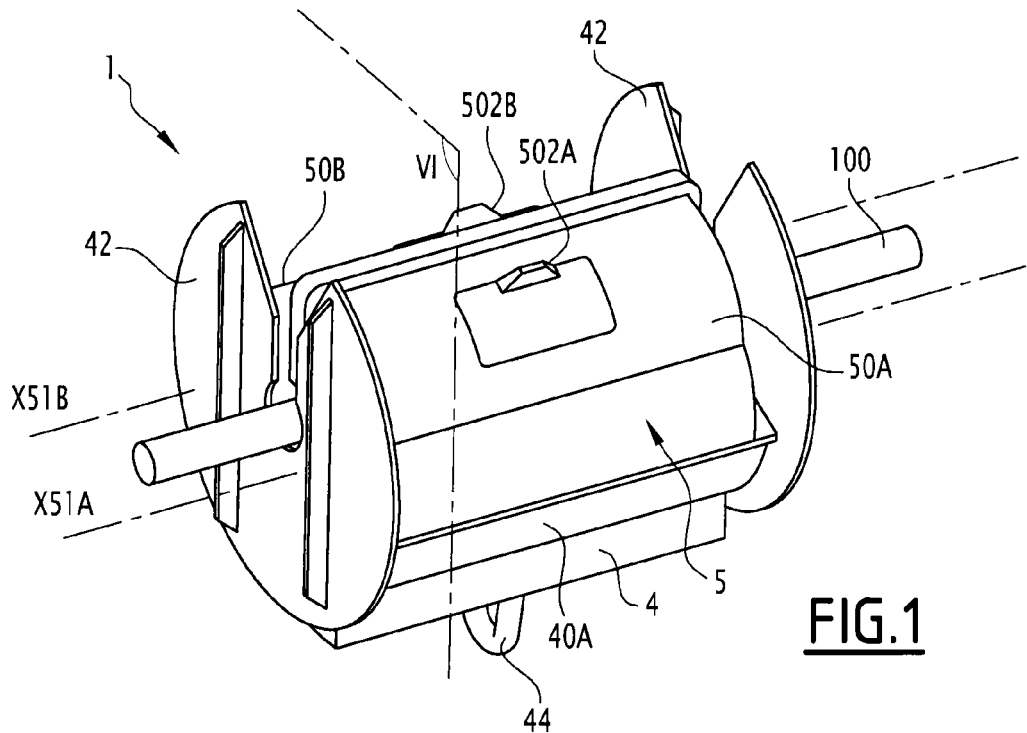
FIG. 1 is a perspective view of a detector according to the invention, locked on an electric conductor.
Figures 2, 3:
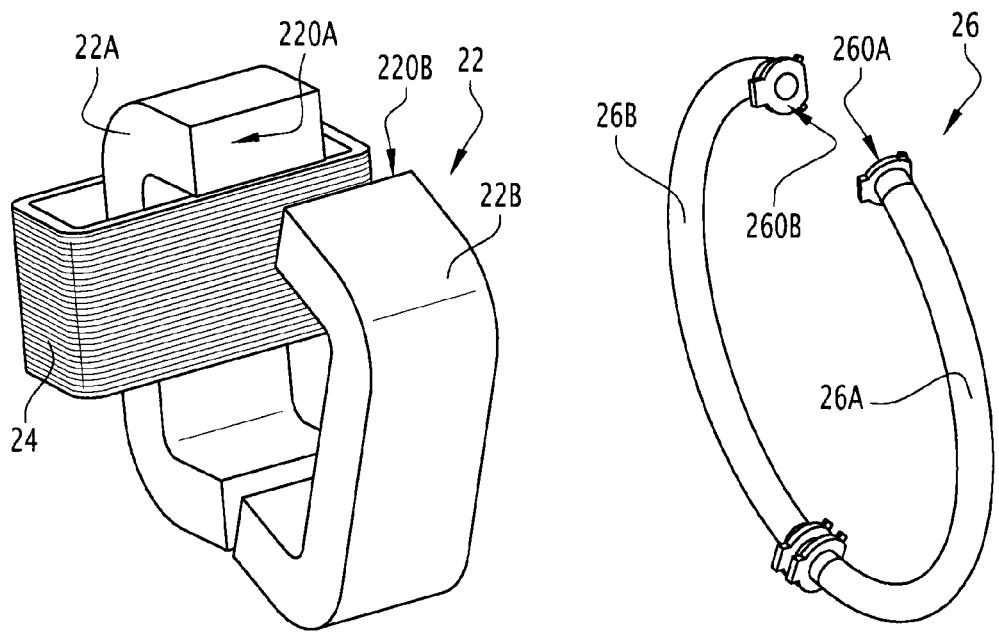
FIG. 2 is a perspective view of a magnetic toroid of the detector of FIG. 1, in the open configuration.
FIG. 3 is a perspective view of a current sensor of the detector of FIG. 1, in the open configuration.

Before the installation, the detector 1 is in the closed configuration, as shown in FIG. 1. In particular, the covers 50A and 50B are closed, the surface 500A bearing against the surface 500B, as well as the magnetic toroid 22, the surface 220A bearing against the surface 220B, and the current sensor 26, the surface 260A bearing against the surface 260B. Furthermore, the clamps 30A and 30B are then in their locked configuration, the protruding members 34A and 34B being below the lines Δ in the illustration of FIG. 7, which induces locking torques C2, as explained above.

From this configuration, which precedes the installation, the covering system 5 can be opened by pulling on the handles 502A and 502B to separate them from one another. The covers 50A and 50B slide on the lateral guide flanges 42 and the fingers 504A and 504B bear against the ends 38A and 38B of the clamps 30A and 30B. This sets the clamps 30A and 30B in rotation around the axes X30A and X30B and brings the protruding members 34A and 34B above the lines Δ, which causes opening torques C1, as explained above. The opening of the clamps 30A and 30B causes the complete opening of the mechanism unit 200, the member 28 transmitting the force from the pairs of clamps 3 to the lid 27 and therefore to the magnetic toroid 22 and the current sensor 26. The opening of the detector 1 is done in a single operation. The open configuration thus obtained can be considered a stable configuration: this results from the operating principle of the pairs of clamps 3.

The detector 1 is then ready for installation. The detector 1 is hoisted to the height of the transmission line 102 with a stick that is anchored to the anchoring ring 44. The electric conductor 100 bears against the portions 282 of the force transmitting element 28 and lowers the trigger 284. As described above, this induces locking torques C2 on the entire mechanism unit 200. In particular, the clamps 30A and 30B close until they bear against the conductor 100. This ensures the anchoring of the detector 1 to the conductor 100 of the line L10, as well as its operation. The current sensor 26, which is then closed, can perform the current measurement, which is next sent to the electronic device 6, that device being powered by the assembly of the toroid 22 and the coil 24. When the device 6 includes a voltage sensor, the potential connection of that sensor is done by the anchoring clamps 30A and 30B. After having processed the output signals from the current sensor and the voltage sensor, the device 6 transmits a radio signal S1 to the concentrator 104, which receives signals from the three detectors 1 mounted on the three lines 102.

To disassemble the detector 1, using the stick anchored to the ring 44, the detector 1 is pulled downward on a slant toward the conductor 100 such that the conductor 100 exerts a force on the clamps 30A and 30B until the springs of the unit 200 produce opening torques C1. This causes the opening of the detector 1, which can therefore be disassembled easily.

The embodiments and alternatives considered above may be combined to generate new embodiments.

The invention claimed is:

1. A detector for detecting at least one electric quantity in an electric conductor, the detector comprising:
    a frame on which a mechanism is fixed, the mechanism including:
        a magnetic toroid, divided into two branches rotatable around an axis defined by the frame, between a separated position and a position closed around the electric conductor, the magnetic toroid having a coil wound around at least one of the two branches,
        a current sensor, divided into two branches rotatable around an axis defined by the frame, between a separated position and a position closed around the electric conductor, the current sensor performing an AC current measurement,
        a force transmitting element transmitting a rotational force to the magnetic toroid and the current sensor, the element being provided with at least one portion to receive the conductor by bearing, and
        a first clamp including two clamp arms, and a second clamp including two clamp arms, the first clamp and the second clamp anchoring the detector on the electric conductor, each of the first clamp and the second clamp being rotatable around an axis parallel to the rotation axis of the branches of the magnetic toroid and defined by the frame, between an open position and a locked position of the respective clamp, and the first clamp being positioned on one side of the magnetic toroid and the second clamp being positioned on another side of the magnetic toroid;
    a base;
    at least one electronic device to send a parameter of the current detected by the current sensor, wherein:
    the force transmitting element is extended by a trigger,
    at least a clamp arm of the clamp arms has a portion in contact with the trigger,
    the clamp arm bears a protruding member protruding in a direction parallel to its axis of rotation, the protruding member being movable with the clamp arm between the open position and the locked position,
    a spring is stretched between the protruding member and a part fixed on the frame,
    the spring exerts a rotational torque on the clamp arm and tends to move the clamp arm toward the open position or its locked position as a function of the angular position of the clamp arm relative to the rotation axis, and between the open position and the locked position, the clamp arm passes through a neutral position where the protruding member, its axis of rotation, and the fixed part are aligned and the spring does not exert a rotational torque on the clamp arm.

2. The detector according to claim 1, wherein, when it is in its locked position, each clamp arm is in contact with the electric conductor, which constitutes an end-of-travel stop for the locking of each clamp arm, irrespective of its diameter.

3. The detector according to claim 1, wherein when they are in the closed position, the branches of the magnetic toroid and the branches of the current sensor bear against one another, independently of the diameter of the electric conductor.

4. The detector according to claim 1, wherein the radial distance between the rotation axis of the clamp and the protruding member is at least two times smaller than the radial distance between the rotation axis of the clamp and the fixed part at the frame.

5. The detector according to claim 1, further comprising:
a covering system comprising two covers that surround the mechanism and are movable therewith to close around the conductor, and at least one elastic return member for the magnetic toroid, and at least one elastic return member for the covering system, returning the covers toward their respective positions closed around the electric conductor.

6. The detector according to claim 1, wherein the current sensor is secured to the magnetic toroid.

7. The detector according to claim 1, wherein the first clamp and the second clamp are positioned along the rotation axis of one of the branches of the magnetic toroid.

8. The detector according to claim 1, wherein the current sensor is a Rogowski coil.

9. The detector according to claim 1, wherein the current sensor includes:
a voltage sensor, the potential connection of which is done by the first clamp and the second clamp, and
an electronic board provided with a computer to process an output signal of the voltage and/or current sensors and generate a radio signal based on those signals.

10. An overhead network for distributing electricity, comprising:
three transmission lines, each line being made up of an electric conductor and provided with a detector for at least one parameter of an AC current in the electric conductor; and
a concentrator configured to receive radio signals transmitted by the detectors and configured to process the radio signals, wherein
at least one detector includes
a frame on which a mechanism is fixed, the mechanism including:
a magnetic toroid, divided into two branches rotatable around an axis defined by the frame, between a separated position and a position closed around the electric conductor, the magnetic toroid having a coil wound around at least one of the two branches,
a current sensor, divided into two branches rotatable around an axis defined by the frame, between a separated position and a position closed around the electric conductor, the current sensor performing an AC current measurement,
a force transmitting element transmitting a rotational force to the magnetic toroid and the current sensor, the element being provided with at least one portion to receive the conductor by bearing, and
a first clamp including two clamp arms, and a second clamp including two clamp arms, the first clamp and the second clamp anchoring the detector on the electric conductor, each of the first clamp and the second clamp being rotatable around an axis parallel to the rotation axis of the branches of the magnetic toroid and defined by the frame, between an open position and a locked position of the respective clamp, and the first clamp being positioned on one side of the magnetic toroid and the second clamp being positioned on another side of the magnetic toroid,
a base,
at least one electronic device to send a parameter of the current detected by the current sensor, wherein:
the force transmitting element is extended by a trigger,
at least a clamp arm of the clamp arms has a portion in contact with the trigger,
the clamp arm bears a protruding member protruding in a direction parallel to its axis of rotation, the protruding member being movable with the clamp arm between the open position and the locked position,
a spring is stretched between the protruding member and a part fixed on the frame,
the spring exerts a rotational torque on the clamp arm and tends to move the clamp arm toward the open position or its locked position as a function of the angular position of the clamp arm relative to the rotation axis, and
between the open position and the locked position, the clamp arm passes through a neutral position where the protruding member, its axis of rotation, and the fixed part are aligned and the spring does not exert a rotational torque on the clamp arm.

11. The overhead network according to claim 10, wherein,
the spring moves the clamp arm toward the locked position as the function of the angular position of the clamp arm relative to the rotation axis, and
when it is in its locked position, each clamp arm is in contact with the electric conductor, which constitutes an end-of-travel stop for the locking of each clamp arm, irrespective of its diameter.

12. The overhead network according to claim 10 wherein the current sensor includes:
a voltage sensor, the potential connection of which is done by the first clamp and the second clamp, and
an electronic board provided with a computer to process an output signal of the voltage and/or current sensors and generate a radio signal based on those signals.

* * * * *